United States Patent
Maegawa et al.

(10) Patent No.: US 11,377,755 B2
(45) Date of Patent: Jul. 5, 2022

(54) N-TYPE SILICON SINGLE CRYSTAL PRODUCTION METHOD, N-TYPE SILICON SINGLE CRYSTAL INGOT, SILICON WAFER, AND EPITAXIAL SILICON WAFER

(71) Applicant: SUMCO CORPORATION, Tokyo (JP)

(72) Inventors: Koichi Maegawa, Nagasaki (JP); Yasuhito Narushima, Nagasaki (JP); Yasufumi Kawakami, Nagasaki (JP); Fukuo Ogawa, Nagasaki (JP); Yuuji Tsutsumi, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 135 days.

(21) Appl. No.: 16/607,205

(22) PCT Filed: Mar. 29, 2018

(86) PCT No.: PCT/JP2018/013362
§ 371 (c)(1),
(2) Date: Oct. 22, 2019

(87) PCT Pub. No.: WO2018/198663
PCT Pub. Date: Nov. 1, 2018

(65) Prior Publication Data
US 2020/0224329 A1 Jul. 16, 2020

(30) Foreign Application Priority Data

Apr. 25, 2017 (JP) ............................. JP2017-086531

(51) Int. Cl.
*C30B 15/04* (2006.01)
*C30B 29/06* (2006.01)
(Continued)

(52) U.S. Cl.
CPC .............. *C30B 29/06* (2013.01); *C30B 15/04* (2013.01); *C30B 15/14* (2013.01); *C30B 15/206* (2013.01)

(58) Field of Classification Search
CPC ......... C30B 29/06; C30B 15/22; C30B 15/04; C30B 15/30
See application file for complete search history.

(56) References Cited

U.S. PATENT DOCUMENTS 10,233,564 B2 * 3/2019 Narushima ............. C30B 15/22
10,240,871 B2 * 3/2019 Dubois .................... C30B 33/02
(Continued)

FOREIGN PATENT DOCUMENTS

CN 101351580 A 1/2009
CN 104106126 A 10/2014
(Continued)

OTHER PUBLICATIONS

International Search Report issued in International Patent Application No. PCT/JP2018/013362, dated Jun. 12, 2018; and English-language translation thereof.
(Continued)

*Primary Examiner* — Robert M Kunemund
(74) *Attorney, Agent, or Firm* — Greenblum & Bernstein, P.L.C.

(57) ABSTRACT

An n-type silicon single crystal production method of pulling up a silicon single crystal from a silicon melt containing red phosphorus as a principal dopant and growing the silicon single crystal by the Czochralski process, the method including: controlling electrical resistivity at a start position of a straight body portion of the silicon single crystal to 0.80 mΩcm or more and 1.05 mΩcm or less; and sequentially lowering the electrical resistivity of the silicon single crystal as the silicon single crystal is up and grown, thereby (Continued)

adjusting electrical resistivity of a part of the silicon single crystal to 0.5 mΩm or more and less than 0.6 mΩcm.

2 Claims, 5 Drawing Sheets

(51) Int. Cl.
*C30B 15/14* (2006.01)
*C30B 15/20* (2006.01)

(56) References Cited

U.S. PATENT DOCUMENTS

| | | | |
|---|---|---|---|
| 2007/0105279 | A1 | 5/2007 | Falster et al. |
| 2008/0029019 | A1* | 2/2008 | Dethloff ............... H01L 31/182 117/13 |
| 2009/0130824 | A1 | 5/2009 | Falster et al. |
| 2011/0140241 | A1 | 6/2011 | Kawazoe et al. |
| 2012/0279437 | A1 | 11/2012 | Johnson |
| 2015/0011079 | A1 | 1/2015 | Yoshida et al. |

FOREIGN PATENT DOCUMENTS

| | | |
|---|---|---|
| DE | 112015005768 T5 | 10/2017 |
| DE | 112016001962 T5 | 1/2018 |
| DE | 112017006524 T5 | 12/2019 |
| JP | 2002-020192 A | 1/2002 |
| JP | 2008-280211 A | 11/2008 |
| JP | 2009-515370 A | 4/2009 |
| JP | 2010-184839 A | 8/2010 |
| JP | 2014-513034 A | 5/2014 |
| JP | 2014-132600 A | 7/2014 |
| JP | 2016-213232 A | 12/2016 |
| KR | 10-2008-0084941 A | 9/2008 |
| WO | 2010/021272 | 2/2010 |
| WO | WO 2012/141121 A1 | 10/2012 |
| WO | 2013/121696 | 8/2013 |

OTHER PUBLICATIONS

International Preliminary Report on Patentability for International Patent Application No. PCT/JP2018/013362, translation thereof dated Oct. 29, 2019; and English-language.

Written Opinion of the International Searching Authority for International Patent Application No. PCT/JP2018/013362, dated Jun. 12, 2018; and English-language translation thereof.

Taiwanese Office Action for Taiwanese Patent Application No. 107106793, dated Feb. 12, 2019; and English-language translation thereof.

Office Action for CN App. No. 201880026821.9, dated Jan. 8, 2021 (w/ translation).

Office Action for KR App. No. 10-2019-7032044, dated Feb. 1, 2021 (w/ translation).

Office Action for JP App. No. 2020-199463, dated Jan. 5, 2022 (w/ translation).

Office Action for DE App. No. 112018002171.8, dated Feb. 17, 2022 (W/ translation).

* cited by examiner

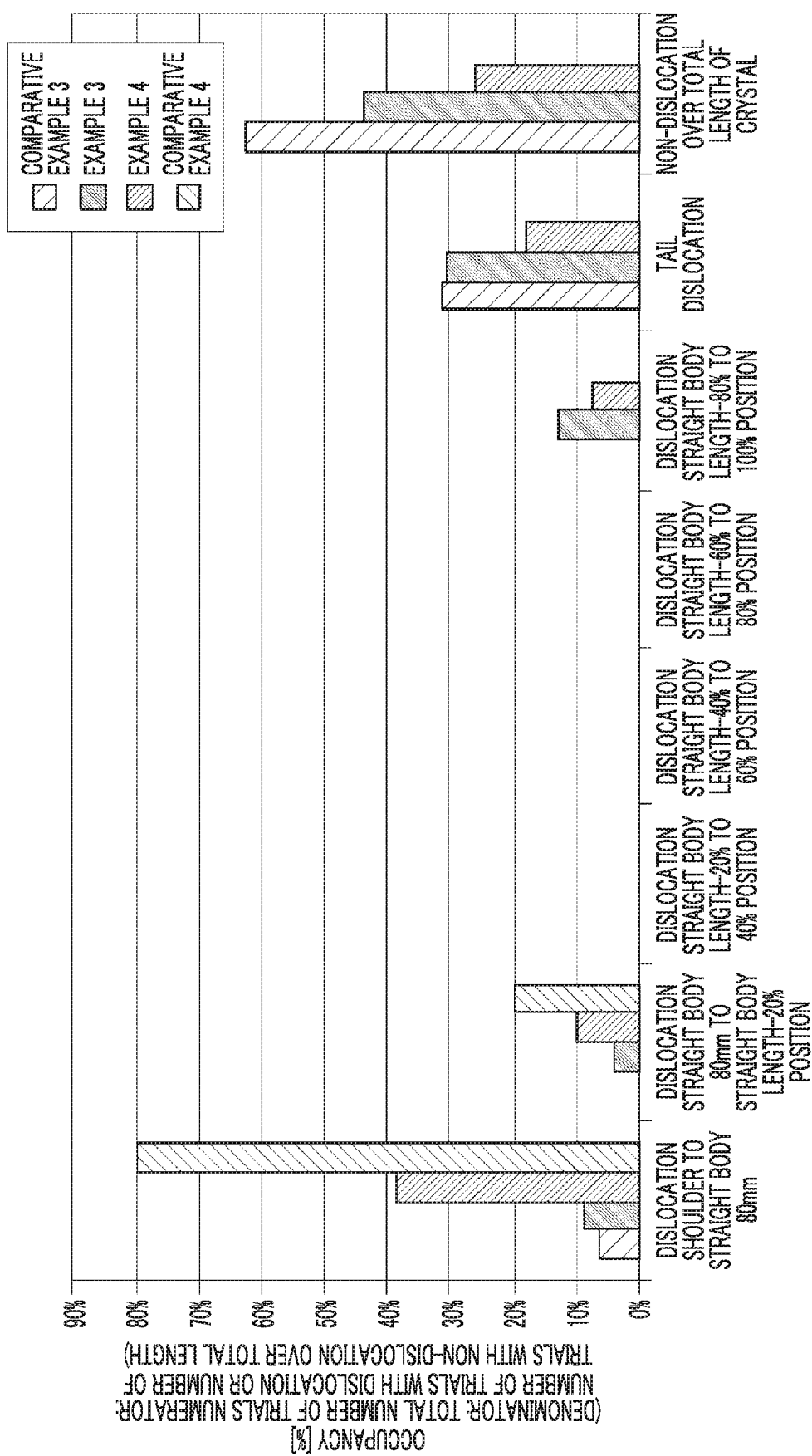

N-TYPE SILICON SINGLE CRYSTAL PRODUCTION METHOD, N-TYPE SILICON SINGLE CRYSTAL INGOT, SILICON WAFER, AND EPITAXIAL SILICON WAFER

TECHNICAL FIELD

The present invention relates to an n-type silicon single crystal production method, an n-type silicon single crystal ingot, a silicon wafer, and an epitaxial silicon wafer.

BACKGROUND ART

In recent years, portable devices such as mobile phones have been in widespread use. There has been intense demand for such portable devices to be carried and used for long periods of time, and efforts to increase the capacity of a battery built into the portable device and to reduce the power consumption of the portable device itself have been made.

In order to reduce the power consumption of the portable device itself, it is necessary to reduce the power consumption of a semiconductor device mounted inside the portable device.

For example, a low breakdown voltage power MOSFET (Metal Oxide Semiconductor Field Effect Transistor), which is used as a power device for a portable device, has a certain electric resistance therein when it is energized, and thus the low breakdown voltage power MOSFET itself consumes power in accordance with a current flowing through the low breakdown voltage power MOSFET.

Accordingly, in a case where it is possible to reduce the internal resistance when the low breakdown voltage power MOSFET is energized, the power consumption of the portable device can be reduced. Based on such a background, there has been intense demand for an n-type silicon single crystal having low electrical resistivity (hereinafter, referred to as low resistivity) to reduce the resistance when the low breakdown voltage power MOSFET is energized.

In a typical production method of a silicon single crystal, the silicon single crystal has been pulled up by controlling electrical resistivity (hereinafter, referred to as resistivity) to a target value such that the silicon single crystal has constant electrical resistivity throughout.

It has been known that in a case where such a low resistivity silicon single crystal is produced by pulling up according to the Czochralski process or the like, dislocation easily occurs in the silicon single crystal during the pulling up.

Patent Literature 1 discloses a technology of preventing the occurrence of dislocation at a tail portion by increasing the resistivity in the tail portion while paying attention to the fact that a dopant concentration is increased is the tail portion just before the completion of pulling up of a silicon single crystal, and that abnormal growth occurs due to compositional supercooling.

CITATION LIST

Patent Literature

[Patent Literature 1] Japanese Patent. Application No. 2010-184839 A

SUMMARY OF THE INVENTION

Problems to Be Solved by the Invention

In a case where the technology described in Patent Literature 1 is used for pulling up of a low resistivity n-type silicon single crystal, n-type dopants such as red phosphorus and arsenic, which are volatile dopants, are evaporated during the pulling up, and thus it is not possible to produce a silicon single crystal whose resistivity is within a desired low resistivity range, or dislocation occurs in a straight body start portion of the silicon single crystal in accordance with an increase in the amount of the n-type dopants added.

In this case, a seed crystal is brought into contact with a melt is a crucible and pulling up is performed again, but in a case where the pulling up is repeated, the manufacturing cost of the silicon single crystal ingot is increased.

An object of the invention is to provide an n-type silicon single crystal production method capable of obtaining a low resistivity n-type silicon single crystal with no increase in the manufacturing cost, an n-type silicon single crystal ingot, a silicon wafer, and an epitaxial silicon wafer.

Means for Solving the Problems

The invention focuses on the occurrence of dislocation at a start position of a straight body portion, and an object of the invention is to prevent the occurrence of dislocation at the start position of the straight body portion by making the resistivity at the start position of the straight body portion larger than a target value, and then sequentially lowering the resistivity.

Specifically, according to an aspect of the invention, there is provided an n-type silicon single crystal production method of pulling up a silicon single crystal from a silicon melt containing volatile dopant red phosphorus as a principal dopant and growing the silicon single crystal by the Czochralski process, the method including: controlling electrical resistivity at a start position of a straight body portion of the silicon single crystal to 0.8 mΩcm or more and 1.05 mΩcm or less; and sequentially lowering the electrical resistivity of the silicon single crystal as the silicon single crystal is pulled up and grown, thereby adjusting electrical resistivity of a part of the silicon single crystal to 0.5 mΩcm or more and 0.7 mΩcm or less.

According to the above aspect of the invention, since it is possible to prevent the occurrence of dislocation at the start position of the straight body portion by adjusting the resistivity at the start position of the straight body portion of the silicon single crystal to 0.8 mΩcm or more and 1.05 mΩcm or less, it is possible to prevent repeated pulling up of the silicon single crystal, and thus it is possible to produce a red phosphorus-doped silicon single crystal having low resistivity without an increase in the manufacturing cost.

According to another aspect of the invention, there is provided an ingot of an n-type silicon single crystal including: red phosphorus as a principal dopant, in which electrical resistivity of a part of the silicon single crystal is 0.5 mΩcm or more and less than 0.6 mΩcm.

According to still another aspect of the invention, there is provided a silicon wafer which is cut out from the ingot of the n-type silicon single crystal and has electrical resistivity of 0.5 mΩcm or more and less than 0.6 mΩcm.

According to a further aspect of the invention, there is provided an epitaxial silicon wafer including: the silicon wafer; and an epitaxial growth film formed on a surface of the silicon wafer.

According to the above aspects of the invention, since it is possible to produce an ingot, a silicon wafer, and an epitaxial silicon wafer of a red phosphorus-doped silicon single crystal having low resistivity of 0.5 mΩcm or more and less than 0.6 mΩcm at low cost, these can be provided to a customer at lower prices.

According to a still further aspect of the invention, there is provided an n-type silicon single crystal production method of pulling up a silicon single crystal from a silicon melt containing volatile dopant arsenic as a principal dopant and growing the silicon single crystal by the Czochralski process, including: controlling electrical resistivity at a start position of a straight body portion of the silicon single crystal to 1.9 mΩcm or more and 2.3 nΩcm or less; and sequentially lowering the electrical resistivity of the silicon single crystal as the silicon single crystal is pulled up and grown, thereby adjusting electrical resistivity of a part of the silicon single crystal to 1.2 mΩcm or more and 1.4 mΩcm or less.

According to the above aspect of the invention, it is possible to produce an arsenic-doped silicon single crystal having low resistivity without an increase in the manufacturing cost by the same advantages and effects as described above.

According to a still further aspect of the invention, there is provided an ingot of an n-type silicon single crystal including: arsenic as a principal dopant, in which electrical resistivity of a part of the silicon single crystal is 1.2 mΩcm or more and 1.4 mΩcm or less.

According to a still further aspect of the invention, there is provided a silicon wafer which is cut out from the ingot of the n-type silicon single crystal and has electrical resistivity of 1.2 mΩcm or more and 1.4 mΩcm or less.

According to a still further aspect of the invention, there is provided an epitaxial silicon wafer including: the silicon wafer; and an epitaxial growth film formed on a surface of the silicon wafer.

According to the above aspects of the invention, it is possible to provide an ingot and a silicon wafer of an arsenic-doped silicon single crystal having low resistivity to a customer lower prices by the same advantages and effects as described above.

BRIEF DESCRIPTION OF DRAWINGS

FIG. 5 is a graph showing a relationship between the straight body length of the silicon single crystal and occupancy [%] (denominator: total number of trials, numerator: number of trials with dislocation or number of trials with non-dislocation over total length) in a case where arsenic is used as a dopant in the embodiment.

DESCRIPTION OF THE EMBODIMENTS

[1] Structure of Silicon Single Crystal Pulling-Up Apparatus 1

Figure 1:
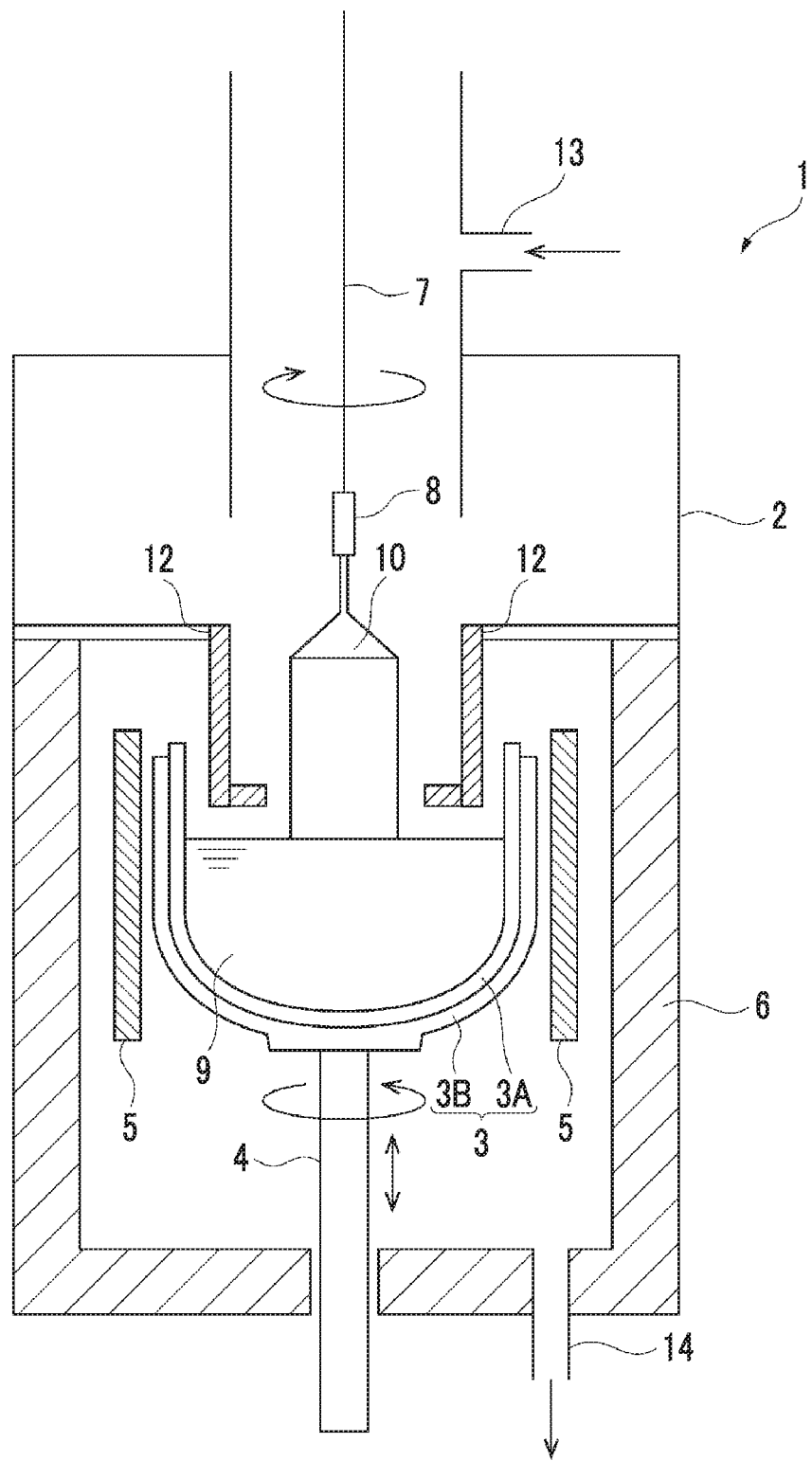
FIG. 1 is a schematic diagram showing an example of a structure of a silicon single crystal pulling-up apparatus according to an embodiment of the invention.

FIG. 1 shows a schematic diagram showing an example of a structure of a silicon single crystal pulling-up apparatus 1 to which an n-type silicon single crystal production method according to an embodiment of the invention can be applied. The pulling-up apparatus 1 is provided with a chamber 2 forming an outer shell, and a crucible 3 disposed in a central portion of the chamber 2.

The crucible 3 has a double structure composed of an inner quartz crucible 3A and an outer graphite crucible 3B, and is fixed to an upper end portion of a support shaft 4 which is rotatable and liftable.

An inner diameter of the quartz crucible 3A inside the crucible 3 is 1.7 times or more and 2.3 times or less relative to a straight body diameter of a silicon single crystal 10 during pulling up.

Specifically, in a case where the straight body diameter of the silicon single crystal 10 is 201 mm or more and 230 nm or less, the inner diameter of the quartz crucible 3A is preferably 2.1 times or more and 2.3 times or less the straight body diameter of the silicon single crystal 10. In a case where the straight body diameter of the silicon single crystal 10 is 301 mm or more and 330 mm or less, the inner diameter of the quartz crucible 3A is preferably 1.7 times or more and 2.0 times or less the straight body diameter of the silicon single crystal 10.

A resistance heating-type heater 5 surrounding the crucible 3 is provided outside the crucible 3, and a heat insulating material 6 is provided along an inner surface of the chamber 2 outside the heater 5.

A pulling shaft 7 such as a wire which rotates at a predetermined speed in the opposite direction or the same direction coaxially with the support shaft 4 is provided above the crucible 3. A seed crystal 8 is attached to a lower end of the pulling shaft 7.

A cylindrical heat shielding plate 12 is disposed in the chamber 2.

The heat shielding plate 12 acts to shield the silicon single crystal 10 being grown from high-temperature radiation heat from a silicon melt 9 in the crucible 3 or the heater 5 or a side wall of the crucible 3, and with respect to the vicinity of a solid-liquid interface which is a crystal growth interface, acts to suppress the diffusion of heat to the outside and control the temperature gradients of a central portion and an outer circumferential portion of the single crystal in a pulling shaft direction.

A gas inlet port 13 for introducing an inert gas such as Ar gas into the chamber 2 is provided in an upper portion of the chamber 2. An exhaust port 14 for sucking and discharging the gas in the chamber 2 by driving vacuum pump (not shown) is provided in a lower portion of the chamber 2.

The inert gas introduced into the chamber 2 from the gas inlet port 13 moves down between the silicon single crystal 10 being grown and the heat shielding plate 12, and flows to the outside of the heat shielding plate 12 and further toward the outside of the crucible 3 after flowing through a gap (liquid level gap) between a lower end of the heat shielding plate 12 and a liquid level of the silicon melt 9. Then, the inert gas moves down along the outside of the crucible 3, and is discharged from the exhaust port 14.

In growing the silicon single crystal 10 using such a growth apparatus, a solid raw material such as a polycrystalline silicon filled in the crucible 3 is melted by heating of the heater 5 while the inside of the chamber 2 is maintained in an inert gas atmosphere under reduced pressure to form the silicon melt 9. In a case where the silicon melt 9 is formed in the crucible 3, the pulling shaft 7 is moved down to immerse the seed crystal 8 in the silicon melt 9, and while the crucible 3 and the pulling shaft 7 are rotated in a predetermined direction, the pulling shaft 7 is gradually pulled up. Accordingly, the silicon single crystal 10 connected to the seed crystal 8 is grown.

[2] Production Method of Silicon Single Crystal 10

In producing the silicon single crystal 10 according to this embodiment using the above-described pulling-up apparatus 1, the silicon single crystal can be produced by appropriately adding red phosphorus or arsenic as a principal dopant in the silicon melt 9 at the beginning of or during the pulling up. In a case where red phosphorus or arsenic is used as a principal dopant, it occupies 50 mass % or more of the n-type dopant, and other dopants may be added.

In a case where red phosphorus is used as a dopant, the resistivity is controlled to 0.80 mΩcm or more and 1.05 mΩcm or less at a start position of a straight body portion of the silicon single crystal 10. Then, the resistivity of the silicon single crystal 10 is sequentially lowered as the silicon single crystal 10 is pulled up and grown, and finally, a silicon single crystal 10 having resistivity of 0.5 mΩcm or more and 0.7 mΩcm or less, and particularly less than 0.6 mΩcm at an end portion of a straight body length is obtained.

Similarly, in a case where arsenic is used as a dopant, the resistivity is controlled to 1.90 mΩcm or more and 2.30 mΩcm or less at the start position of the straight body portion of the silicon single crystal 10. Then, the resistivity of the silicon single crystal 10 is sequentially lowered as the silicon single crystal 10 is pulled up and grown, and finally, a silicon single crystal having resistivity of 1.2 mΩcm or more and 1.4 mΩcm or less is obtained.

The ingot of the silicon single crystal 10 according to this embodiment can be pulled up under general pulling-up conditions. In that case, examples of means for increasing concentration of the dopant such as red phosphorus or arsenic in the silicon melt 9 in the crucible 3 include adding the dopant during pulling up, using an increase in the dopant concentration due to a segregation phenomenon accompanying the pulling up, suppressing the evaporation of the dopant by changing the amount of the inert gas to be introduced into the chamber 2, and changing the pressure in the chamber 2.

Specifically, in the first half of the pulling up of the straight body portion of the silicon single crystal 10, in a case where it is necessary to suppress the evaporation of the dopant and raise the dopant concentration in the silicon melt 9 in the crucible 3, the Ar flow rate is 50 L/min to 150 L/min, and the furnace pressure is 40 kPa to 80 kPa.

Meanwhile, in the second half of the pulling up of the straight body portion of the silicon single crystal 10, in a case where it is necessary to promote the evaporation the dopant and maintain the dopant concentration in the silicon melt 9 in the crucible 3 by offseting with an increase in the dopant concentration due to the segregation that accompanies the progress of growth of the silicon single crystal 10, the Ar flow rate is 50 L/min to 200 L/min, and the furnace pressure is 20 kPa to 80 kPa.

Regarding a part of the silicon single crystal 10 pulled up by the pulling-up apparatus 1, in a case where red phosphorus is used as a dopant, an ingot of a silicon single crystal 10 having resistivity of 0.5 mΩcm or more and less than 0.6 mΩcm at a portion near the tall of the silicon single crystal 10 is obtained.

A silicon wafer having resistivity of 0.5 mΩcm or more and less than 0.6 mΩcm can be obtained by cutting out the above portion into the silicon wafer with a wire saw or the like and subjecting the cut-out silicon wafer to a lapping step and a polishing step.

Furthermore, an annealing heat treatment is performed after the silicon wafer processing, and then an epitaxial growth film is formed on a surface of the silicon wafer to produce and ship an epitaxial silicon wafer to a customer.

In a case where arsenic is used as a dopant, silicon single crystal 10 having resistivity of 1.2 mΩcm or more and 1.4 mΩcm or less at a portion near the tail of the silicon single crystal 10 is obtained.

The above portion cut out into a silicon wafer with a wire saw or the like, and the cut-out silicon wafer is subjected to a lapping step and a polishing step, and then shipped to a customer. The customer forms an epitaxial growth film needed and produces a semiconductor.

EXAMPLES

In pulling up of a silicon single crystal 10 having a crystal diameter of 201 mm to 231 mm, a ratio of an inner diameter of a crucible 3 to the crystal diameter (=inner diameter of the crucible 3/crystal diameter) was 1.8 to 2.3, a charge amount was 80 kg to 180 kg, a pulling-up speed was 0.3 mm/min to 1.0 mm/min, and a crystal rotation speed was 9 rpm to 17 rpm in the examples.

In the first half of the straight body portion of the silicon single crystal 10, the argon gas flow rate was 50 L/min to 150 L/min, and the furnace pressure was 40 kPa to 80 kPa. In the second half of the straight body portion of the silicon single crystal 10, the Ar flow rate was 50 L/min to 200 L/min, and the furnace pressure was 20 kPa to 80 kPa.

[1] Using Red Phosphorus as Dopant

While the resistivity was controlled by addition of a red phosphorus dopant; change of an Ar flow rate, a furnace pressure, or a height position of a heat shielding plate 12 from the liquid level; change of the pulling-up speed of the silicon single crystal 10; or a combination thereof according to a position in a straight body length of the silicon single crystal 10, the red phosphorus-doped silicon single crystal 10 was pulled up. The results thereof are shown in Table 1 and FIG. 2. In the following description, a straight body length-0% position means a start position of the straight body portion of the silicon single crystal 10, and a straight body length-100% position means a start position of the tail of the silicon single crystal 10.

TABLE 1

|  |  | Comparative Example 1 | Example 1 | Example 2 | Comparative Example 2 |
|---|---|---|---|---|---|
| Resistivity [mΩcm] | Straight Body Length-0% Position (end of shoulder) | 1.2 | 1.05 | 0.8 | 0.75 |
|  | Straight Body Length-20% Position | 1.05 | 0.92 | 0.73 | It was not possible to |

TABLE 1-continued

|  | Comparative Example 1 | Example 1 | Example 2 | Comparative Example 2 |
|---|---|---|---|---|
| Straight Body Length-40% Position | 0.92 | 0.8 | 0.66 | acquire a single crystal. |
| Straight Body Length-60% Position | 0.82 | 0.7 | 0.61 |  |
| Straight Body Length-80% Position | 0.75 | 0.63 | 0.56 |  |
| Straight Body Length-100% Position (start position of tail) | 0.7 | 0.58 | 0.52 |  |

In addition, whether dislocation hat occurred was investigated in each case. The results thereof are shown in Table 2 and FIG. 3. The diameter of the silicon single crystal was controlled within a range of 201 mm or more and 230 mm or less to obtain a single crystal of a wafer for 200 mm. In Table 2, a straight body-acceptable length is a value obtained by dividing the length of the straight body region where the resistivity is acceptable and there is no dislocation by a total straight body length, and occupancy is a number of trials with dislocation/a total number of trials or a number of trials with non-dislocation over total length/a total number of trials.

TABLE 2

|  |  | Comparative Example 1 | Example 1 | Example 2 | Comparative Example 2 |
|---|---|---|---|---|---|
| Occupancy (number of trials/number of trials) | Shoulder to 80 mm | 5% | 22% | 44% | 93% |
|  | 80 mm to 20% | 0% | 11% | 11% | 7% |
|  | 20% to 40% | 0% | 0% | 0% | 0% |
|  | 40% to 60% | 0% | 0% | 0% | 0% |
|  | 60% to 80% | 0% | 0% | 0% | 0% |
|  | 80% to 100% | 0% | 11% | 11% | 0% |
|  | Tail | 45% | 22% | 11% | 0% |
| Percentage with Non-Dislocation over Total Crystal Length (number of trials/number of trials) |  | 50% | 33% | 22% | 0% |
| Number of Trials of Pulling Up |  | 20 | 9 | 9 | 15 |
| Straight Body-Acceptable Length (0.7 mΩcm or less) |  | 0% | 40% | 70% | 0% |
| Straight Body-Acceptable Length (less than 0.6 mΩcm) |  | 0% | 10% | 35% | 0% |

Figure 2:
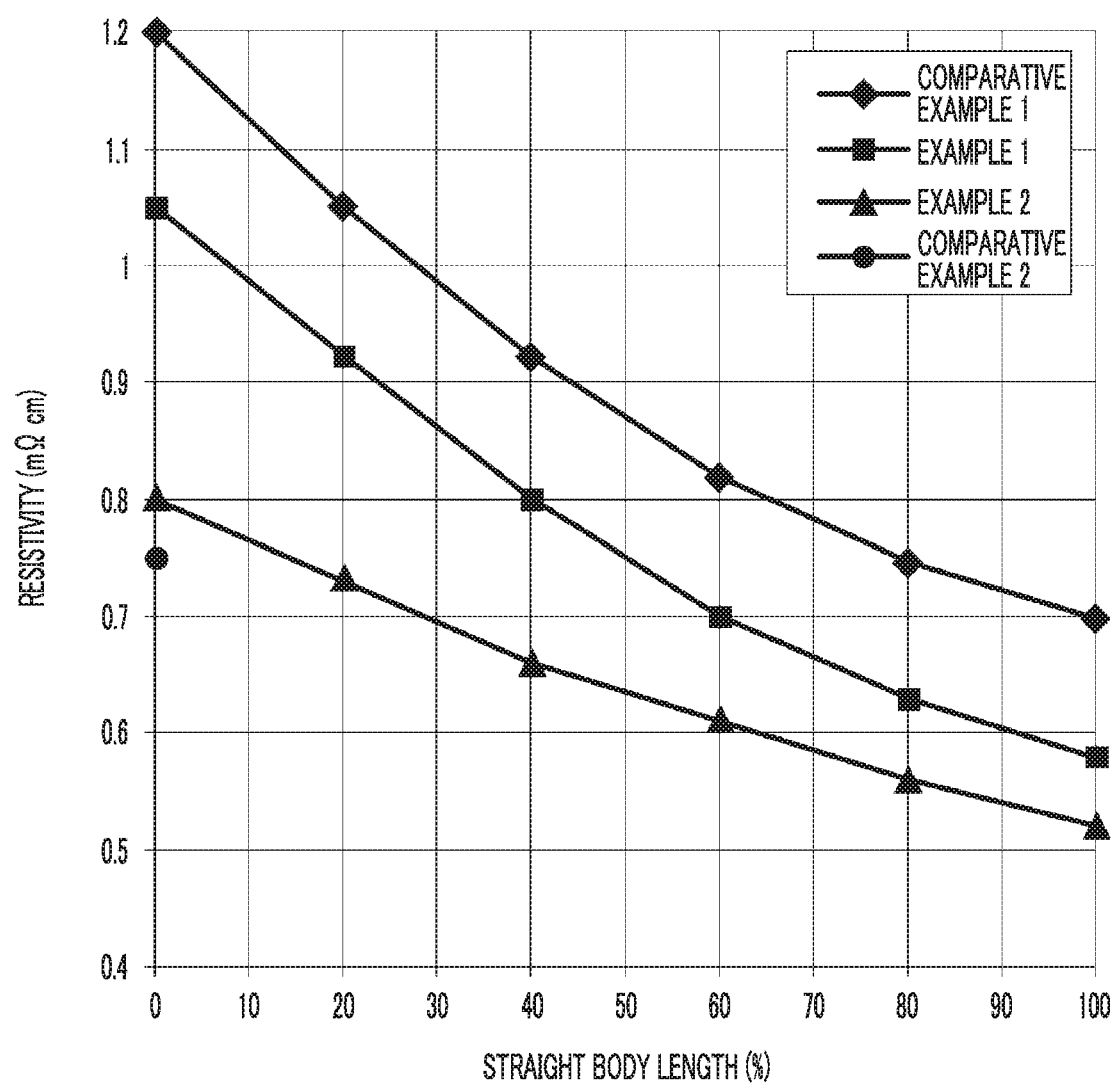
FIG. 2 is a graph showing a relationship between a straight body length and resistivity of a silicon single crystal in a case where red phosphorus is used as a dopant in the embodiment.
Figure 3:
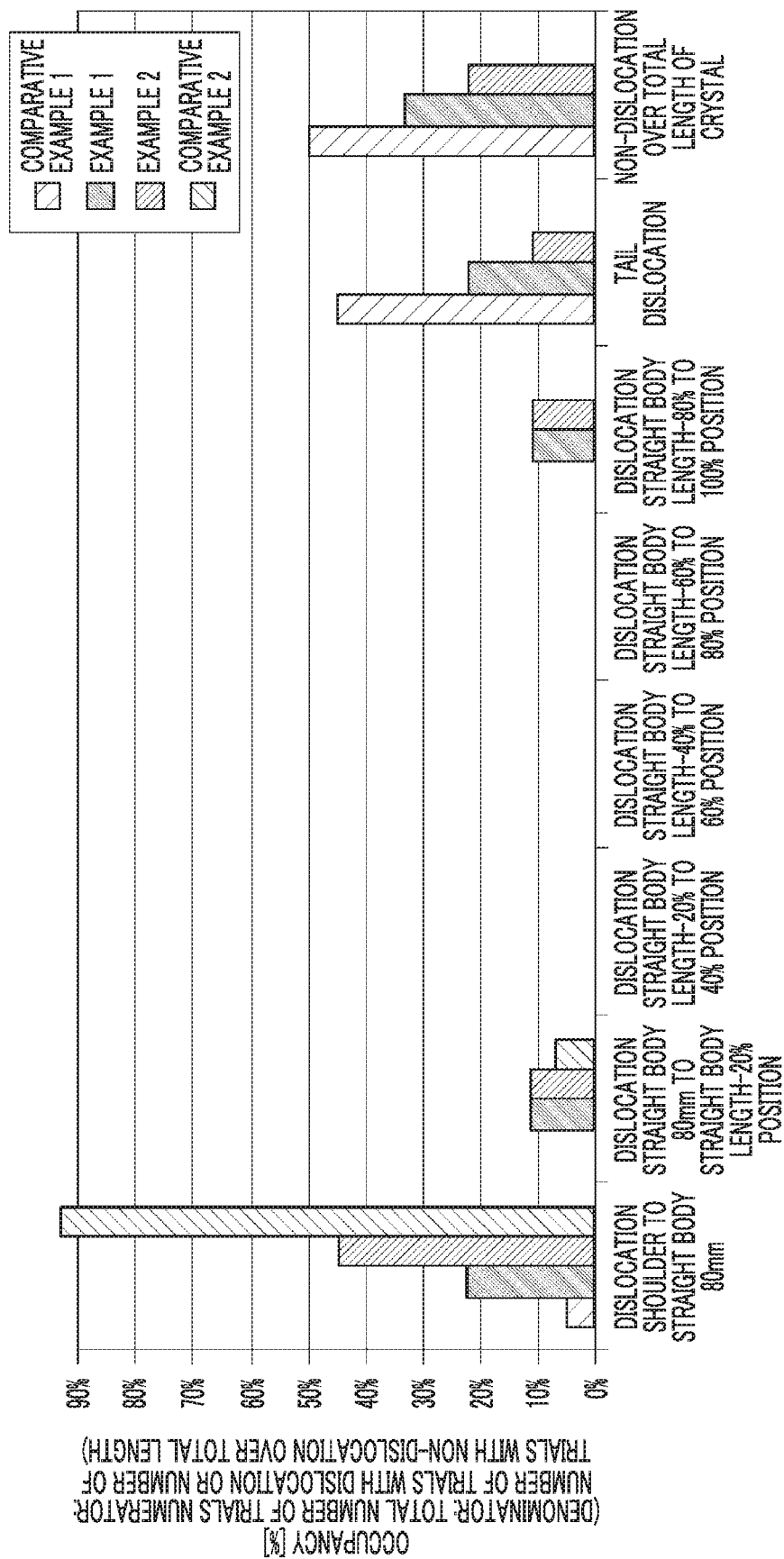
FIG. 3 is a graph showing a relationship between the straight body length of the silicon single crystal and occupancy [%] (denominator: total number of trials, numerator: number of trials with dislocation or number of trials with non-dislocation over total length) in a case where red phosphorus is used as a dopant in the embodiment.

As can be seen from Table 2 and FIG. 3, it is possible to prevent the occurrence of dislocation with a high probability that the rate occurrence of dislocation up to 80 mm away from the start position of the straight body portion is 5% in a silicon single crystal of Comparative Example 1. However, as can be seen from Table 1 and FIG. 2, the resistivity halts at a decrease to 0.7 mΩcm even at a straight body-100% position, and thus a low resistivity silicon single crystal having resistivity of 0.7 mΩcm or less cannot be produced.

As can be seen from Table 1 and FIG. 2, dislocation occurred throughout a silicon single crystal of Comparative Example 2 from 80 mm away from the start position of the straight body portion to a straight body length-20% position, and a silicon single crystal could not be produced.

In contrast, it has been confirmed that the resistivity of a silicon single crystal of Example 1 can be reduced to 0.7 mΩcm or less at a position of 60% from the start position of the straight body portion, the rate of occurrence of dislocation can be suppressed to 22% at a position 80 mm away from the start position of the straight body portion, and thus a silicon single crystal having low resistivity of 0.7 mΩcm or less can be produced. Particularly, it has been confirmed that a single crystal having extremely low resistivity of less than 0.6 mΩcm, which could not be produced until now, can be produced in 90% or more of the straight body length.

Similarly, it has been confirmed that the resistivity of a silicon single crystal of Example 2 can be reduced to 0.7 mΩcm or less at a position of 30% from the start position of the straight body portion, the rate of occurrence of dislocation can be suppressed to 44% at a position 80 mm away from the start position of the straight body portion, and thus a silicon single crystal having low resistivity of 0.7 mΩcm or less is produced. Particularly, it has been confirmed that a single crystal having extremely low resistivity of less than 0.6 mΩcm, which could not be produced until now, can be produced in 65% or more of the straight body length.

[2] Using Arsenic as Dopant

While the resistivity was controlled by addition of an arsenic dopant according to a position in a straight body length of the silicon single crystal, the arsenic-doped silicon single crystal was pulled up. The results thereof are shown in Table 3 and FIG. 4.

TABLE 3

|  |  | Comparative Example 3 | Example 3 | Example 4 | Comparative Example 4 |
|---|---|---|---|---|---|
| Resistivity [mΩcm] | Straight Body Length-0% Position (end of shoulder) | 2.6 | 2.3 | 1.9 | 1.8 |
|  | Straight Body Length-20% Position | 2.2 | 2 | 1.66 | It was not possible to acquire a single crystal. |
|  | Straight Body Length-40% Position | 1.95 | 1.75 | 1.5 |  |
|  | Straight Body Length-60% Position | 1.75 | 1.55 | 1.37 |  |
|  | Straight Body Length-80% Position | 1.6 | 1.42 | 1.29 |  |
|  | Straight Body Length-100% Position (start position of tail) | 1.5 | 1.33 | 1.22 |  |

In addition, whether dislocation had occurred was investigated in each case. The results thereof are shown in Table 4 and FIG. 5.

TABLE 4

|  |  | Comparative Example 3 | Example 3 | Example 4 | Comparative Example 4 |
|---|---|---|---|---|---|
| Occupancy (number of trials/number of trials) | Straight body start to 80 mm | 6% | 9% | 38% | 80% |
|  | 80 mm to 20% | 0% | 4% | 10% | 20% |
|  | 20% to 40% | 0% | 0% | 0% | 0% |
|  | 40% to 60% | 0% | 0% | 0% | 0% |
|  | 60% to 80% | 0% | 0% | 0% | 0% |
|  | 80% to 100% | 0% | 13% | 8% | 0% |
|  | Tail | 31% | 30% | 18% | 0% |
| Percentage withNon-Dislocation over Total Crystal Length (number of trials/number of trials) |  | 63% | 44% | 26% | 0% |
| Number of Trials of Pulling Up |  | 16 | 23 | 39 | 10 |
| Straight Body-Acceptable Length (1.4 mΩcm or less) |  | 0% | 17% | 45% | 0% |

As can be seen from Table 4 and FIG. 5, the rate of occurrence of dislocation up to 80 mm away from the start position of the straight body portion is small, that is, 6% in a silicon single crystal of Comparative Example 3, and it is possible to prevent the occurrence of dislocation. However, as can be seen from Table 3 and FIG. 4, the resistivity halts at a decrease to 1.5 mΩcm even at a straight body length-100% position, and thus a low resistivity silicon single crystal having resistivity of 1.4 mΩcm or less cannot be produced.

Figure 4:
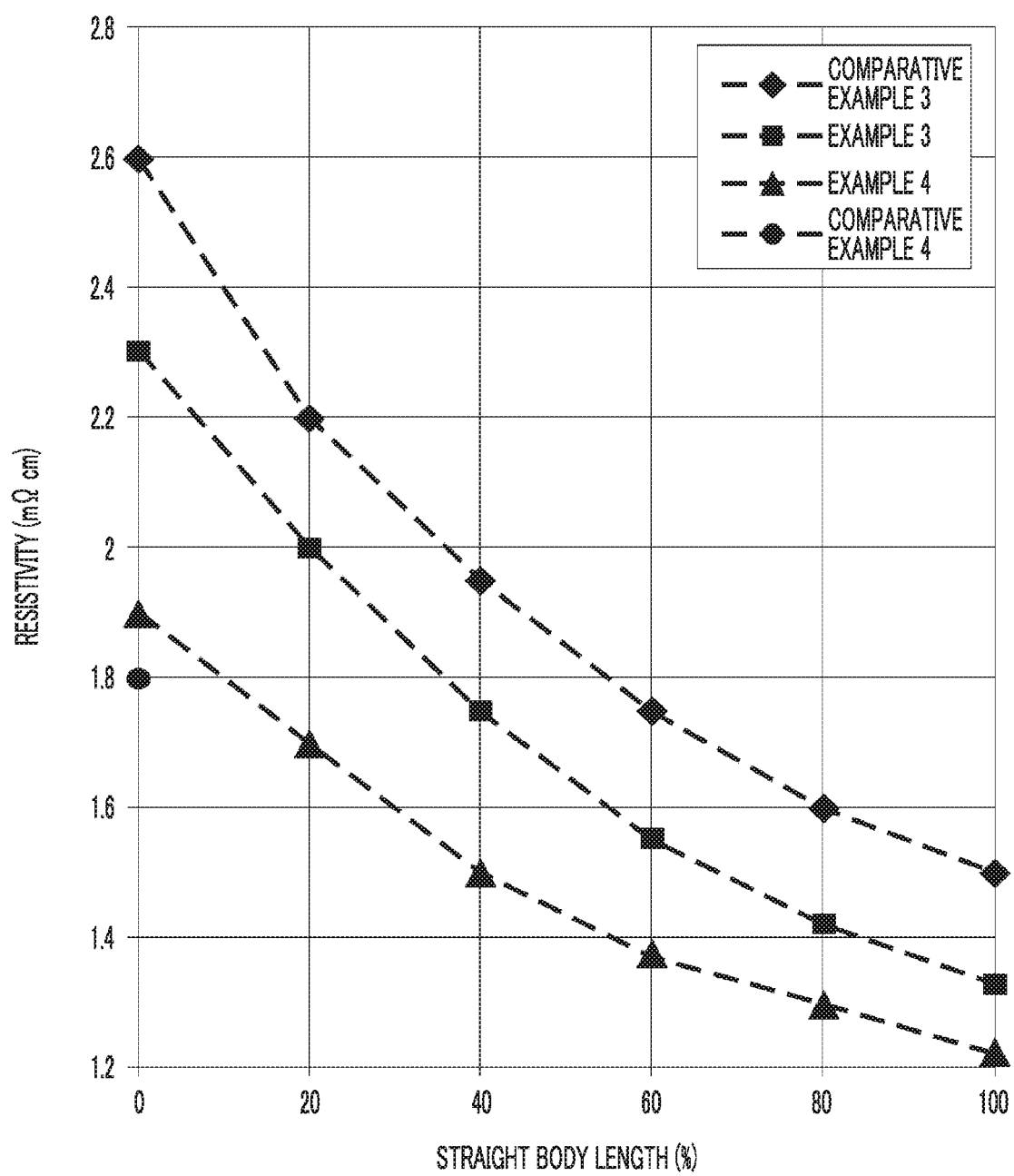
FIG. 4 is a graph showing a relationship between a straight body length and resistivity of a silicon single crystal in a case where arsenic is used as a dopant in the embodiment.

As can be seen from Table 3 and FIG. 4, dislocation occurred throughout a silicon single crystal of Comparative Example 4 from 80 mm away from the start position of the straight body portion to a straight body length-20% position, and a silicon single crystal could not be produced.

In contrast, it has been confirmed that the resistivity of a silicon single crystal of Example 3 can be reduced to 1.4 mΩcm or less at a position of 85% from the start position of the straight body portion, the rate of occurrence of dislocation can be suppressed to 9% at a position 80 mm away from the start position of the straight body portion, and thus a silicon single crystal having low resistivity of 1.4 mΩcm or less can be produced.

Similarly, it has been confirmed that the resistivity of a silicon single crystal of Example 4 can be reduced to 1.4 mΩcm or less at a position of 55% from the start position of the straight body portion, the rate of occurrence of dislocation can be suppressed to 38% at a position 80 mm away from the start position of the straight body portion, and thus a silicon single crystal having low resistivity of 1.4 mΩcm or less can be produced.

As described above, in pulling up of a single crystal 10 from a silicon melt 9 containing red phosphorus as a dopant by the Czochralski process, in a case where the resistivity of the silicon single crystal 10 at the start position of the straight body portion was controlled to 0.80 mΩcm or more and 1.05 mΩcm or less, and then the resistivity of the silicon single crystal 10 was sequentially lowered as the silicon single crystal 10 was pulled up and grown, the resistivity of a part of the silicon single crystal 10 could be adjusted to 0.5 mΩcm or more and 0.7 mΩcm or less, and particularly to extremely low resistivity of less than 0.6 mΩcm which could not be obtained until now, and it was possible to suppress the occurrence of dislocation in the silicon single crystal 10.

Similarly, in pulling up of a silicon single crystal 10 from a silicon melt 9 containing arsenic as a dopant by the Czochralski process, in a case where the resistivity of the silicon single crystal at the start position of the straight body portion was controlled to 1.90 mΩcm or more and 2.30 mΩcm or less, and then the resistivity of the silicon single crystal was sequentially lowered as the silicon single crystal 10 was pulled up and grown, the resistivity of a part of the silicon single crystal 10 could be adjusted to 1.2 mΩcm or more and 1.4 mΩcm or less, and it was possible to suppress the occurrence of dislocation in the silicon single crystal 10.

The invention claimed is:

1. An n-type silicon single crystal production method of pulling up an n-type silicon single crystal from a silicon melt in a crucible, the silicon melt containing red phosphorus as a principal dopant and growing the n-type silicon single crystal by the Czochralski process, the method further comprising:

setting an inner diameter of the crucible at 1.7 times or more and 2.3 times or less relative to a straight body diameter of the silicon single crystal during pulling up;

controlling electrical resistivity at a start position of a straight body portion of the n-type silicon single crystal to 0.80 mΩcm or more and 1.05 mΩcm or less; and sequentially lowering the electrical resistivity of the n-type silicon single crystal, as the n-type silicon single crystal is pulled up and grown, such that the electrical resistivity of a portion of the n-type silicon single crystal is adjusted to 0.5 mΩcm or more and 0.7 mΩcm or less, wherein:

an Ar flow rate is from 50 L/min to 150 L/min, and a furnace pressure is from 40 kPa to 80 kPa in a first half of the pulling up of the straight body portion, and the Ar flow rate is from 50 L/min to 200 L/min, and the furnace pressure is from 20 kPa to 80 kPa in a second half of the pulling up of the straight body portion.

2. An n-type silicon single crystal production method of pulling up an n-type silicon single crystal from a silicon melt in a crucible, the silicon melt containing arsenic as a principal dopant and growing the n-type silicon single crystal by the Czochralski process, the method further comprising:

setting an inner diameter of the crucible at 1.7 times or more and 2.3 times or less relative to a straight body diameter of the silicon single crystal during pulling up;

controlling electrical resistivity at a start position of a straight body portion of the n-type silicon single crystal to 1.90 mΩcm or more and 2.30 mΩcm or less; and sequentially lowering the electrical resistivity of the n-type silicon single crystal, as the n-type silicon single crystal is pulled up and grown, such that the electrical resistivity of a portion of the n-type silicon single crystal is adjusted to 1.2 mΩcm or more and 1.4 mΩcm or less, wherein:

an Ar flow rate is from 50 L/min to 150 L/min, and a furnace pressure is from 40 kPa to 80 kPa in a first half of the pulling up of the straight body portion, and the Ar flow rate is from 50 L/min to 200 L/min, and the furnace pressure is from 20 kPa to 80 kPa in a second half of the pulling up of the straight body portion.

* * * * *